(12) United States Patent
Lefranc

(10) Patent No.: US 6,440,574 B2
(45) Date of Patent: Aug. 27, 2002

(54) SUBSTRATE FOR HIGH-VOLTAGE MODULES

(75) Inventor: Guy Lefranc, Müchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/776,948

(22) Filed: Feb. 5, 2001

Related U.S. Application Data

(63) Continuation of application No. PCT/DE99/02384, filed on Aug. 3, 1999.

(30) Foreign Application Priority Data

Aug. 5, 1998 (DE) .......................................... 198 35 396

(51) Int. Cl.⁷ ............................................... B32B 15/04
(52) U.S. Cl. ..................................................... 428/469
(58) Field of Search ................................ 428/469, 545, 428/688; 174/68.1; 361/679

(56) References Cited

U.S. PATENT DOCUMENTS 5,986,218 A    11/1999    Muto et al.

FOREIGN PATENT DOCUMENTS

| DE | 30 39 440 A1 | 4/1982 |
|---|---|---|
| EP | 0 714 127 A2 | 5/1996 |
| EP | 0 717 586 A1 | 6/1996 |
| JP | 03 283 586 | 12/1991 |
| JP | 06 152 146 | 5/1994 |
| JP | 06 318 776 | 11/1994 |
| JP | 08 172 248 | 7/1996 |
| JP | 09 129 989 | 5/1997 |
| JP | 09 135 057 | 5/1997 |

Primary Examiner—Deborah Jones
Assistant Examiner—Gwendolyn Blackwell-Rudasill
(74) Attorney, Agent, or Firm—Laurence A. Greenberg; Werner H. Stemer; Ralph E. Locher

(57) ABSTRACT

The substrate for high-voltage modules has a ceramic later with a first main side and a second main side opposite to the first main side. The ceramic layer has a first dielectric constant. A top metal layer is disposed on the first main side and a bottom metal layer is disposed on the second main side. To reduce field tips, a dielectric layer with a second dielectric constant borders the top metal layer and is disposed on the first main side of the ceramic layer. The density of the field lines on the edges of the voltage-conducting elements is thus attenuated so that the dielectric constants of the ceramic layer and the dielectric layer match each other.

5 Claims, 3 Drawing Sheets

SUBSTRATE FOR HIGH-VOLTAGE MODULES

CROSS-REFERENCE TO RELATED APPLICATION

This application is a continuation of copending International Application No. PCT/DE99/02384, filed Aug. 3, 1999, which designated the United States.

BACKGROUND OF THE INVENTION

Field of the Invention

The invention relates to a substrate for high voltage modules with a reduced electric field strength.

In electronics and electrical engineering, circuits and circuit devices are often built up on boards or insulating material metallized on two sides. For example, in power electronics, ceramic boards coated with copper on both sides are used. The ceramic board thereby constitutes an insulator with a given dielectric constant. The components are mounted on the structured metal layer. In this case, very high electric field strengths occur, in particular at the lateral edges of the upper metal layer, because of the high electrical voltage present between the contact surfaces. For example, the field strength is up to 50 kV/mm at a voltage of 5000 V. At this field strength, because of the breakdown voltage being exceeded at the transition to the ceramic, that is to say to the insulator, the insulation requirements which are placed on power modules can no longer be met or at least can no longer be complied with reliably.

SUMMARY OF THE INVENTION

The object of the present invention is to provide a substrate for a high voltage module which overcomes the above-noted deficiencies and disadvantages of the prior art devices and methods of this general kind, and in which, with the same geometry of insulator and metallization, the breakdown voltage is shifted to higher values.

With the above and other objects in view there is provided, in accordance with the invention, a substrate for high voltage modules, comprising:

- a ceramic layer having a first main side, a second main side opposite the first main side, and a first dielectric constant $\epsilon_1$;
- an upper metal layer on the first main side and a lower metal layer on the second main side; and
- a dielectric layer with a second dielectric constant $\epsilon_2$ disposed on the first main side adjacent the upper metal layer on the ceramic layer.

In other words, the solution is based on reducing the field strength at the edges of the metallization. To this end, a dielectric layer with a second dielectric constant is provided on the ceramic layer, adjoining the upper metallization. As a result, the maximum field strength at the transition from the substrate (ceramic and metallization) to its surroundings can be reduced substantially.

The advantage of the invention resides in the fact that no significant change has to be made to the basic structure of the components currently used but, with the invention, simple protection can be achieved against peak discharges which would destroy the electronic circuit.

In accordance with an added feature of the invention, the upper metal layer is at least partly embedded in the ceramic layer.

In accordance with an additional feature of the invention, the upper metal layer is connected to the lower metal layer via the dielectric layer. This permits the suppression of the surface discharge at the edge of the metallizations which, at excessively high operating voltages, can lead to destruction of the soft encapsulation.

In a preferred embodiment, the second dielectric constant $\epsilon_2 \geq 10$.

In accordance with a concomitant feature of the invention, the dielectric layer has a thickness approximately equal to a thickness of one of the upper metal layer and the lower metal layer.

Since the dissipation of the field peak depends on the thickness of the dielectric layer, it is advantageous to have the thickness of the dielectric layer approximately assume the thickness of the upper or the lower metal layer. A high dielectric constant also leads to the dissipation of the field peak.

Other features which are considered as characteristic for the invention are set forth in the appended claims.

Although the invention is illustrated and described herein as embodied in a substrate for high voltage modules, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
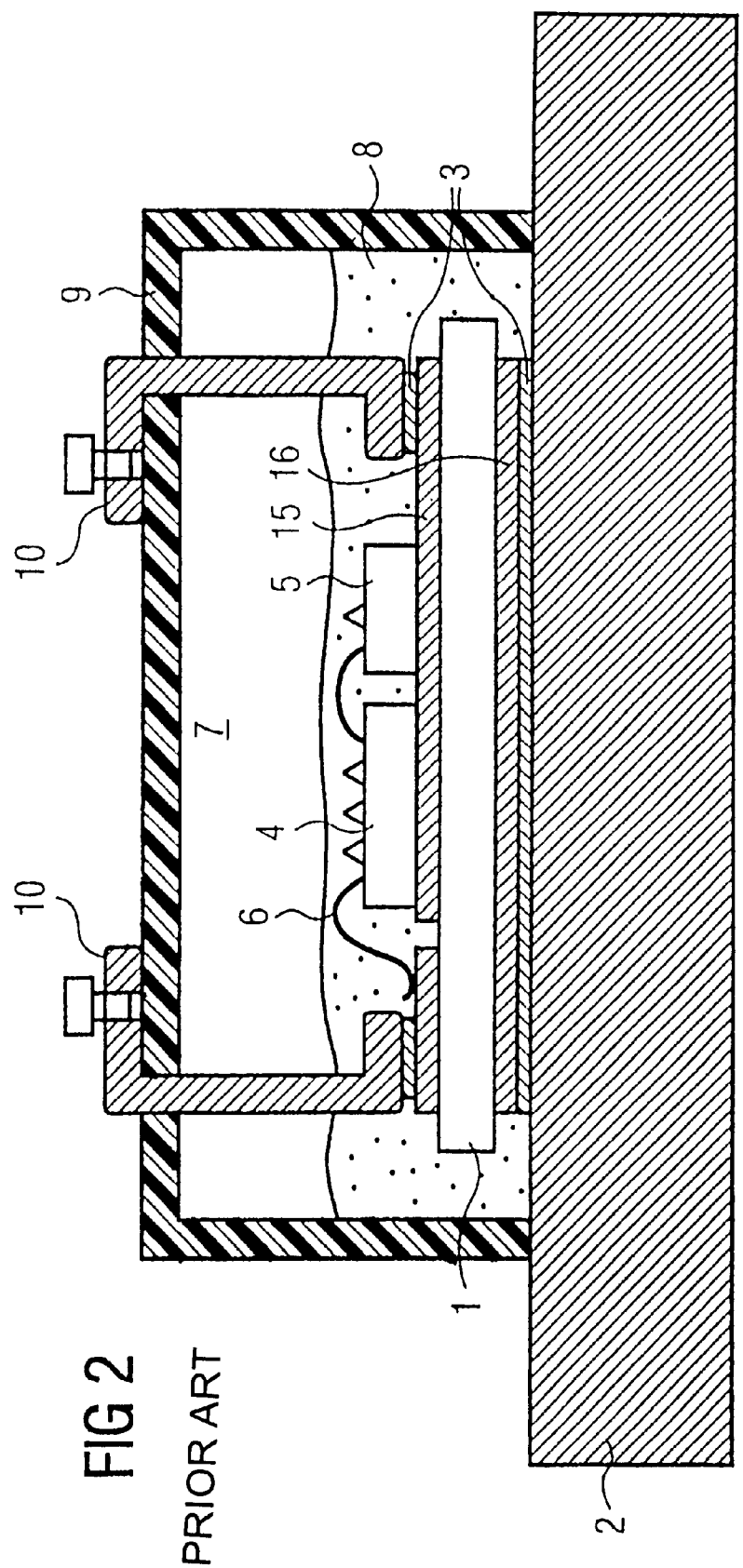
FIG. 2 is a sectional view taken through a conventional prior art encapsulated circuit element.

Referring now to the figures of the drawing in detail and first, particularly, to cross-sectional view of FIG. 2, there is seen a typical construction of an encapsulated circuit element according to the prior art.

The AlN-DCB substrate, on which the circuit is built up, is designated by 1. Substrate 1 is an insulator of high quality, generally a ceramic plate, which has a dielectric constant of about $\epsilon_r = 10$. The insulator 1 is fixed to a copper baseplate 2, which is used both for the mechanical stabilization of the circuit and to thermally connect the circuit to the outside. In other words, the copper baseplate 2 holds the components of the circuit and ensures that heat is dissipated from the components to a heat sink cooling element. In this case, the AlN substrate is connected to the copper baseplate 2 via soldered connections 3.

In the form illustrated, the electronic circuit includes an IGBT 4 and a diode 5, which are designed for voltages of, say, 1600 V. The components 4 and 5 are connected to each other, for example by aluminum thick-wire bonding wires 6 and/or via metallizations on the insulator 1. The aluminum wires 6 in the case of thick wire bonding preferably have a thickness of about 200–500 μm.

The entire circuit construction is encapsulated in a soft encapsulation 8, for example silicon gel, and is then incorporated in a plastic housing 9, which is preferably fixed directly to the copper baseplate 2 and is filled with a hard encapsulating compound 7. Only the feed lines, with load-current contacts 10, are led out of the plastic housing 9. In addition, the load-current contacts 10 are also connected to the circuit in the housing 9 via soldered connections 3.

In the housing according to the prior art, high field strengths occur at the edges, tips and structures of live elements which have a small radius of curvature. In particular at the edge of the substrate, that is to say at the edge of the metallization, but also as a result firstly of the geometric arrangement and secondly of the material properties, field strengths occur which exceed the local voltage resistance. This results in electrical flashovers, which cause local damage and therefore loss of insulation of the module. The invention proposes to moderate "sharp" transitions between the media, at which a higher density of the field lines occurs, by matching the dielectric constant. According to the invention, therefore, as shown in FIG. 1, the area between the upper metallization, which carries a high voltage, and the ceramic edge is embedded in a dielectric, so that the metallization layer dips at least partly into the insulating compound.

Figure 3:
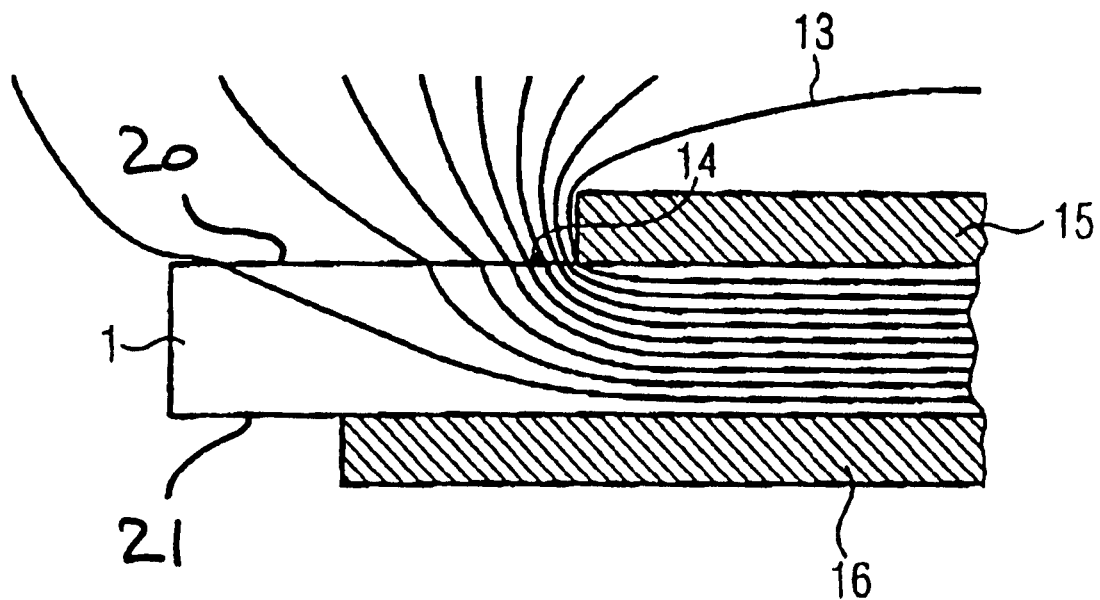
FIG. 3 is a diagram showing the field profile in a configuration according to the prior art.

The field profile in such a construction according to the prior art is shown in FIG. 3 in an enlarged detail from the illustration in FIG. 2. On the upper and the lower surfaces 20, 21 of the AlN ceramic layer 1 there are located an upper and a lower metal layer 15, 16, so that a "sandwich" structure results. The lower metal layer 16 of the construction shown in FIG. 3 may be in thermal contact with the copper baseplate 2, and therefore with a cooling element, via a soldered connection. From the density of the equipotential lines 13 in FIG. 3 it can be seen that at the edges 14 a high field strength prevails in this construction according to the prior art, so that if a material-dependent breakdown field strength is exceeded, uncontrolled discharges occur, as a result of which sensitive components of the circuit can be destroyed.

According to the invention, by means of a dielectric layer 11 adjoining the upper metal layer 15 on the upper surface 20 of the ceramic plate 1, the field profile of the electric field strength is influenced in such a way that the field does not emerge abruptly from the metallic elements of the structure; instead the field lines experience only a relatively small deflection. As a result, the density of the field lines is kept below a given level, and a flashover becomes less probable.

Figure 1A:
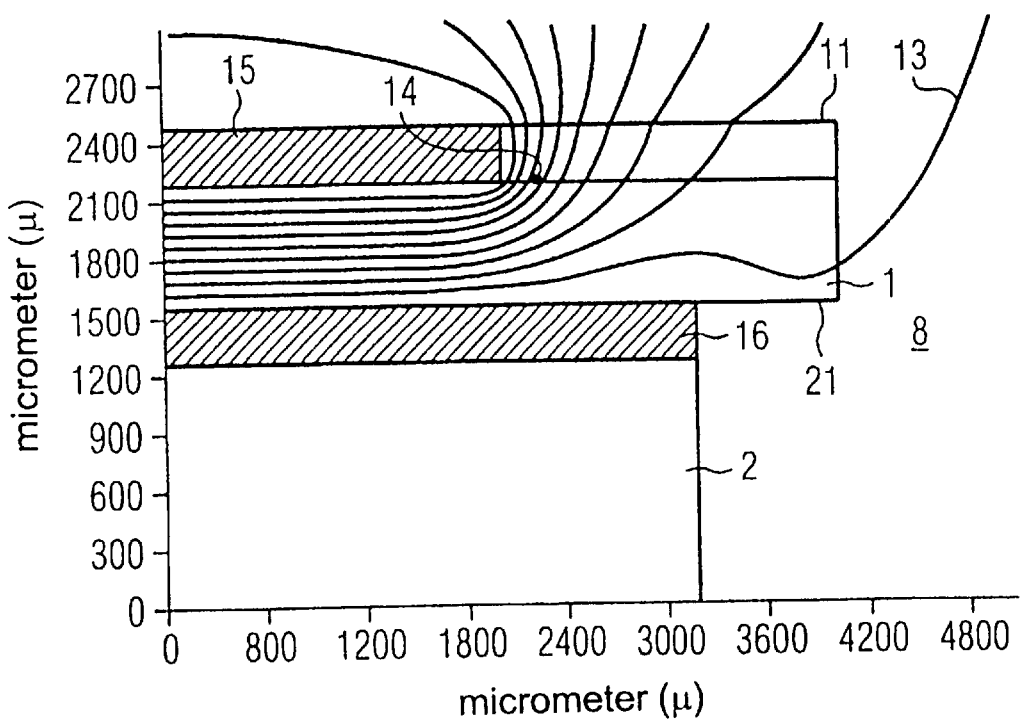
FIGS. 1A and 1B each show the field profile in a configuration according to the present invention.

FIG. 1A shows the profile of the equipotential lines 13 at the edges 14, in a similar illustration to FIG. 3. According to the invention, the edges 14 are embedded in the dielectric layer 11. As can be seen, the equipotential lines are therefore pulled apart, so to speak, as compared with the illustration in FIG. 3. This means that the field strength is reduced at the edges 14 and other structures, which reduces the risk of a breakdown or flashover. In this case, it is important only that the edges 14 are themselves covered by the insulating compound 11, that is to say the dielectric.

Figure 1B:
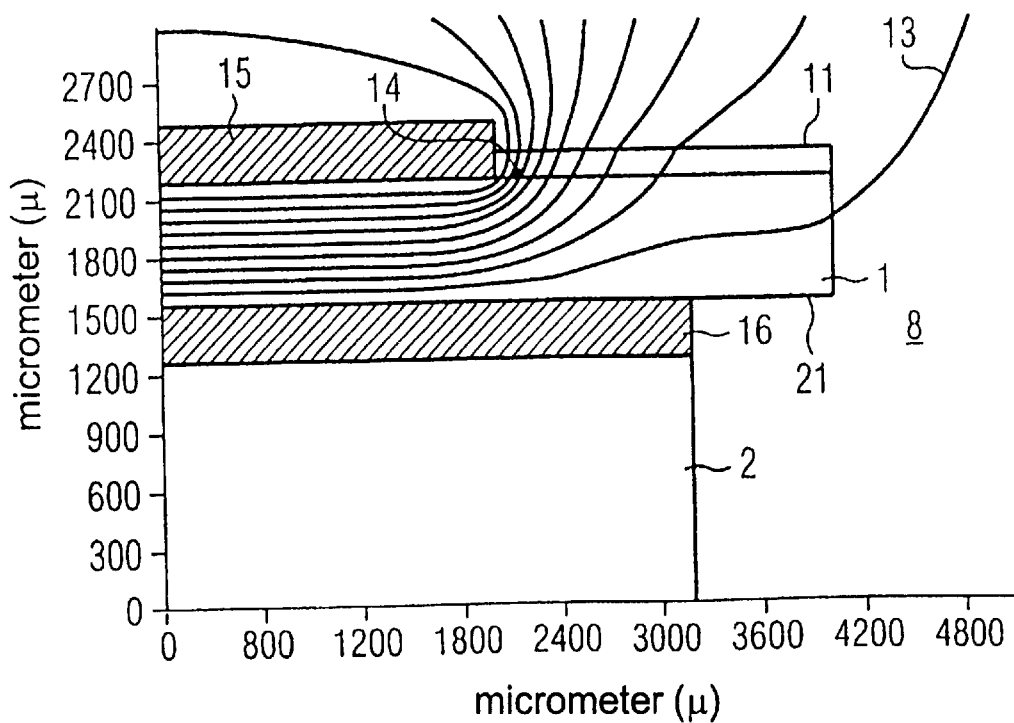

For the purposes of comparison, FIG. 1B shows the situation in which the configuration is only partly connected to the dielectric layer 11. It can be seen that the equipotential lines 13 lie closer to one another as compared with the situation in FIG. 1A. However, the partial covering of the edges and structures of the subassembly with a small radius of curvature may be adequate if the voltages in the subassembly also remain limited.

Figure 4:
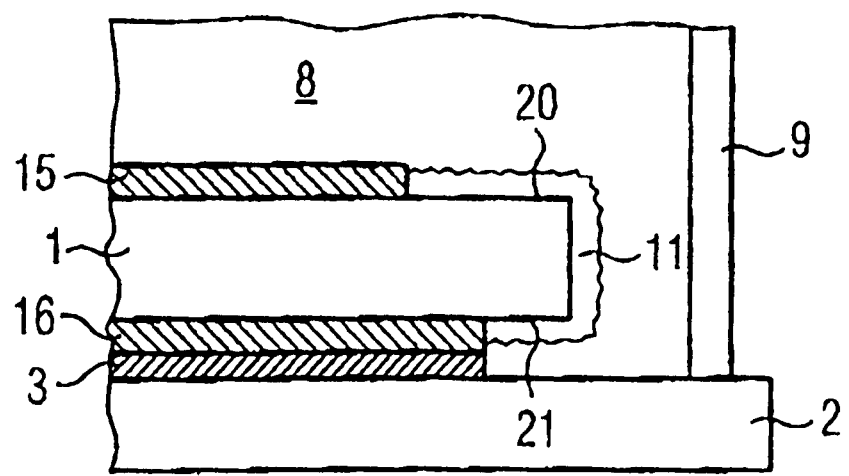
FIG. 4 is a detail of a preferred configuration of the substrate according to the invention.

FIG. 4 illustrates a preferred embodiment of the invention. The ceramic layer 1 is connected to the baseplate 2 via the lower metal layer 16 and the soldered connection 3. The edge of the upper metal layer 15 is spaced further apart from the edge of the ceramic layer 1 than the edge of the lower metal layer 16. This is a measure, known from the prior art, for reducing field peaks. The upper metal layer 15 is connected to the lower metal layer 16 via the dielectric layer 11. The dielectric layer 11 runs along the surface of the ceramic layer 1. The latter is approximately as thick as the metallic layers 15, 16. As is known from the prior art, the substrate according to the invention is surrounded by a soft encapsulation 8.

The dissipation of the field peak at the edges of the metal layers depends on the thickness and the dielectric constant of the dielectric layer. It has been shown in trials, that at a layer thickness of about 200 µm of the dielectric layer, a dielectric constant of $\in \geq 10$ is required in order to dissipate the field peak. At a dielectric constant of $\in =100$, the result is then a reduction of the field peak by a factor 2. The dissipation of the field peak is advantageously carried out both during steady-state and in transient operation.

In practice, the substrate according to the invention for high voltage modules can assume the following characteristic values: the ceramic layer 1 is typically composed of AlN. The thickness d is, for example, 0.63 mm. The dielectric constant of the ceramic layer 1 is, for example, $\in =8.9$. The thickness of the upper and the lower metal layers 15, 16 is selected to be 300 µm. The dielectric constant of the soft encapsulation is then, for example, $\in =2.95$. In order to be able to dissipate the field peak adequately, the layer thickness of the dielectric layer 11 is selected to be 200 µm. The dielectric constant $\in$ of the dielectric layer advantageously has a value $\geq 100$.

I claim:

1. A substrate for high voltage modules, comprising:
   a ceramic layer having a first main side, a second main side opposite said first main side, and a first dielectric constant $\in_1$;
   an upper metal layer on said first main side and a lower metal layer on said second main side;
   a dielectric layer with a second dielectric constant $\in_2$ disposed on said first main side adjacent said upper metal layer on said ceramic layer; and
   a soft encapsulation encapsulating said ceramic layer, said upper metal layer, and said dielectric layer.

2. The substrate for high voltage modules according to claim 1, wherein said upper metal layer is at least partly embedded in said ceramic layer.

3. The substrate for high voltage modules according to claim 1, wherein said upper metal layer is connected to said lower metal layer via said dielectric layer.

4. The substrate for high voltage modules according to claim 3, wherein said second dielectric constant $\in_2 \geq 10$.

5. The substrate for high voltage modules according to claim 1, wherein said dielectric layer has a thickness approximately equal to a thickness of one of said upper metal layer and said lower metal layer.

* * * * *